United States Patent
Choi et al.

(10) Patent No.: US 11,444,201 B2
(45) Date of Patent: Sep. 13, 2022

(54) LEAKAGE CURRENT REDUCTION IN POLYSILICON-ON-ACTIVE-EDGE STRUCTURES

(71) Applicant: QUALCOMM Incorporated, San Diego, CA (US)

(72) Inventors: Youn Sung Choi, San Diego, CA (US); Kwanyong Lim, San Diego, CA (US); Youseok Suh, San Diego, CA (US); Hyunwoo Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/831,010

(22) Filed: Mar. 26, 2020

(65) Prior Publication Data
US 2021/0305429 A1    Sep. 30, 2021

(51) Int. Cl.
| | | |
|---|---|---|
| *H01L 21/82* | (2006.01) | |
| *H01L 29/78* | (2006.01) | |
| *H01L 29/66* | (2006.01) | |
| *H01L 29/10* | (2006.01) | |
| *H01L 21/8234* | (2006.01) | |
| *H01L 27/088* | (2006.01) | |

(52) U.S. Cl.
CPC .. *H01L 29/7855* (2013.01); *H01L 21/823412* (2013.01); *H01L 21/823431* (2013.01); *H01L 21/823456* (2013.01); *H01L 27/0886* (2013.01); *H01L 29/1037* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 9,922,832 B1* | 3/2018 | Han | H01L 27/11521 |
| 2016/0284695 A1* | 9/2016 | Liaw | H01L 27/088 |
| 2019/0355719 A1* | 11/2019 | Maeda | H01L 21/823821 |
| 2021/0083065 A1* | 3/2021 | Chang | H01L 21/823431 |

* cited by examiner

*Primary Examiner* — Joseph C. Nicely
*Assistant Examiner* — Lamont B Koo
(74) *Attorney, Agent, or Firm* — Patterson+ Sheridan, L.L.P. Qualcomm (57) ABSTRACT

Certain aspects of the present disclosure generally relate to techniques for reducing leakage current in polysilicon-on-active-edge structures. An example transistor structure includes one or more active devices and at least one dummy device disposed at an edge of the transistor structure, wherein the at least one dummy device has a different gate structure than the one or more active devices.

18 Claims, 5 Drawing Sheets

600

602
FORM ONE OR MORE ACTIVE DEVICES

604
FORM AT LEAST ONE DUMMY DEVICE DISPOSED AT AN EDGE OF THE TRANSISTOR STRUCTURE, WHEREIN THE AT LEAST ONE DUMMY DEVICE HAS A DIFFERENT GATE STRUCTURE THAN THE ONE OR MORE ACTIVE DEVICES

LEAKAGE CURRENT REDUCTION IN POLYSILICON-ON-ACTIVE-EDGE STRUCTURES

TECHNICAL FIELD

Certain aspects of the present disclosure generally relate to electronic components and, more particularly, to techniques for reducing leakage current in polysilicon-on-active-edge structures.

BACKGROUND

The electronics industry has experienced an ever-increasing demand for smaller and faster electronic devices that are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (finFET). The finFET gets its name from the fin-like structure that extends from a substrate on which it is formed, and which is used to form the FET channel. FinFETs are compatible with conventional complementary metal-oxide-semiconductor (CMOS) processes and their three-dimensional structure allows finFETs to be aggressively scaled while maintaining gate control and mitigating SCEs. In addition, at least one aspect of IC scaling has included reducing cell size (e.g., as part of a layout process). In some examples, reduction in finFET cell size has included abutment of active regions, such as finFET active regions, in neighboring cells. In some cases, active region abutment across neighboring cells may be referred to as a "continuous active region." In various examples, a continuous active region can lead to significant leakage current.

SUMMARY

Certain aspects of the present disclosure relate to transistor cell structures having an active device and a dummy device with a different gate structure (and potentially a different threshold voltage), as well as techniques for fabricating such transistor cell structures.

Certain aspects of the present disclosure are directed to a transistor structure. The transistor structure generally includes one or more active devices and at least one dummy device disposed at an edge of the transistor structure, wherein the at least one dummy device has a different gate structure than the one or more active devices.

Certain aspects of the present disclosure are directed to a method for fabricating a transistor structure. The method generally includes forming one or more active devices and forming at least one dummy device disposed at an edge of the transistor structure, wherein the at least one dummy device has a different gate structure than the one or more active devices.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are directed to techniques and apparatus for reducing leakage current in polysilicon-on-active-edge structures, which may include complementary metal-oxide-semiconductor (CMOS) technology, for example. In some cases, such techniques involve different design rules and processing schemes for fabricating a transistor cell structure, which may include one or more polysilicon dummy structures formed on one or more edges of an active area of the transistor cell structure, as described below. Generally, the transistor structure may include one or more active devices and at least one dummy device disposed at an edge of the transistor structure, wherein the at least one dummy device has a different gate structure than the one or more active devices.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Example Standard Cell

A standard cell may be selected from a commercially available library that is parameterized to a particular semiconductor manufacturing facility, which may be referred to as a foundry. Because the standard cell library is parameterized, the semiconductor devices that will be manufactured should operate in a way that closely matches a post-layout simulation performed using a post-layout netlist schematic, which includes resistor-capacitor (RC) loading and parasitic device models. In this way, the user can quickly create a new integrated circuit and be assured that the silicon or other semiconductor device obtained from the manufacturer will operate as expected. Software design tools for the standard cell methodology are available commercially from several vendors.

Figure 1A:
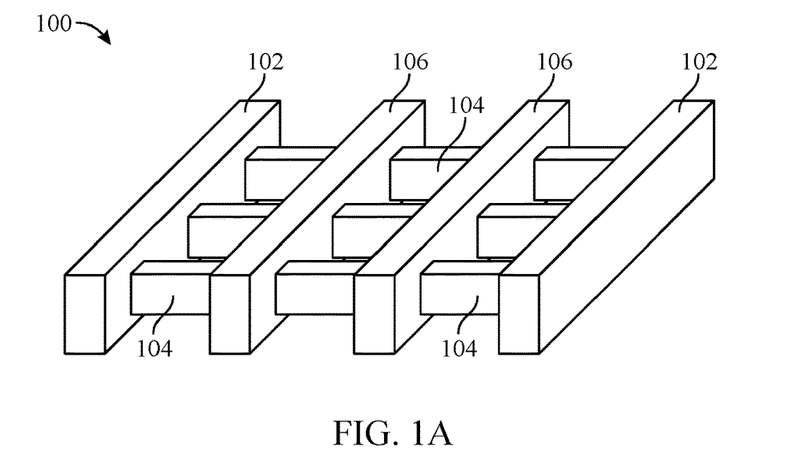
FIG. 1A illustrates a projection view of a standard cell including a plurality of fin field-effect transistors.

FIG. 1A is a simplified projection view of a standard cell 100 (also referred to as a "standard cell structure"). In some cases, the standard cell 100 may be implemented using complementary metal-oxide-semiconductor (CMOS) technology, for example. As illustrated, the standard cell 100 may include fin field-effect transistors (finFETs). In other cases, the standard cell 100 may be implemented using a different type of transistor device, such as a gate-all-around (GAA) transistors. In finFETs, a fin of semiconductor material is formed over an insulating layer. This semiconductor fin can include the source and drain regions for a transistor. The fin may have source and drain doped regions on either side of a channel region, or, in an alternative approach the fin may be uniformly doped. The fins may be formed using silicon-on-insulator (SOI) technology, for example, or may be patterned from an epitaxial layer of semiconductor material, such as silicon. In FIG. 1A, one or more channel structures 104 (e.g., fins) may be arranged in parallel and extend across an active area or oxide-defined (OD) area for the standard cell 100.

The use of standard cells to design integrated circuits provides a method to reduce the design cycle time involved to implement a new function in silicon or another semiconductor material by using a library of known functional primitive blocks, including, for example but without limitation, NAND-NAND, NAND-NOR, XOR, AND-OR logical blocks, and other functional blocks such as adders, multiplexers, de-multiplexers, flip-flops, register files, input and output buffers, and the like. Register files, stacks, and other data storage blocks can also be part of the library of standard cells. By using a library of blocks that already have a verified layout defined at the transistor level, the layout design need not be performed for each new functional definition for an integrated circuit to be manufactured.

Further, by defining the standard cell library using physical cell structures having a predetermined uniform layout pitch, dense packing of the cells can be obtained, so that a very dense placement of the transistors is achieved. Automatic placement and routing tools may be used with the standard cell library and the corresponding predefined layouts of the standard cells to further shorten the time involved to manufacture an integrated circuit that implements a user-defined function. The standard cell 100 is one illustrative example of a standard cell formed using finFETs.

Gate conductors 106 are shown formed in parallel with one another and intersecting the one or more channel structures 104 of the standard cell 100. Gate conductors 106 may be composed of polysilicon, such as a doped polysilicon material, formed over the channel structures 104. At each intersection between a gate conductor 106 and a channel structure 104, an active device (e.g., a finFET), may be formed, for example, with a thin gate dielectric arranged therebetween. In some cases, the thin dielectric may be an oxide, nitride, or low-κ dielectric material formed between the gate polysilicon and the channel structure. When finFETs are compared to conventional planar metal-oxide-semiconductor (MOS) transistors, finFETs have an expanded gate width per unit of semiconductor area because, unlike conventional planar transistors, finFETs have a gate region that includes the two vertical sides of the semiconductor fin, as well as the horizontal top portion, which greatly increases the gate width without increasing the surface area of overall integrated circuit, taking advantage of the three-dimensional fin structure. FinFET devices also tend to have higher performance in terms of leakage current, as well as lower susceptibility to short-channel effects. As device sizes continue to be reduced with higher performance semiconductor processes, the use of finFET devices is increasing.

As shown, dummy structures 102 may be formed on the edges (e.g., the ends) of the standard cell 100, intersecting the one or more channel structures 104. At each intersection between a dummy structure 102 and a channel structure 104, a dummy device may be formed. A dummy device is generally an active device that is physically formed, but not actually used in realizing an electrical circuit design. The dummy structures 102 may be used to protect the ends of the one or more channel structures 104 during processing. That is, the dummy structures 102 may not be electrically connected as gates for transistor devices and generally have no active function in the circuit. Instead, as noted, the dummy structures 102 may be used to cover and protect the ends of the one or more channel structures 104, providing additional reliability during processing. While the dummy structures 102 may generally be used to protect the ends of the one or more channel structures 104, in certain cases, the dummy structures 102 may also be used for routing within the standard cell 100. Dummy structures 102 comprising polysilicon may also be known as "polysilicon on oxide-defined edge (PODE) structures" or "polysilicon-on-active-edge structures."

Figure 1B:
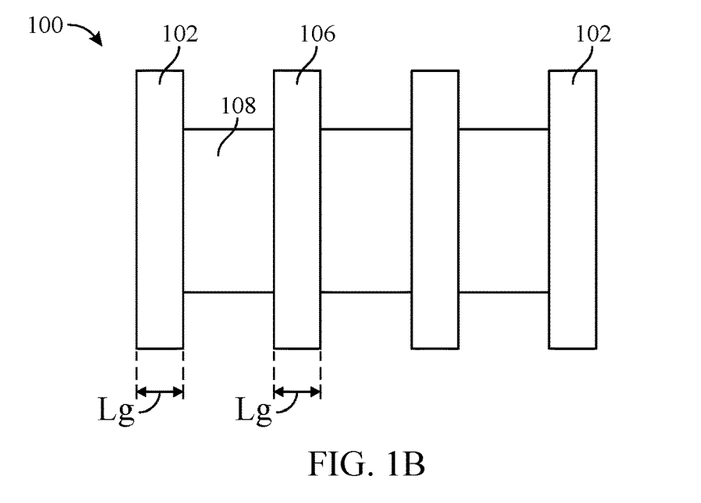
FIG. 1B illustrates a top view of the standard cell of FIG. 1.

FIG. 1B depicts a top view of the standard cell 100 of FIG. 1A. In FIG. 1B, the top view illustrates an active area 108 of the standard cell 100, the gate conductors 106, and the dummy structures 102. The active area 108 may be defined by and include one or more channel structures 104 (e.g., fins) (not shown) having a longitudinal axis disposed perpendicular to the dummy structures 102 and gate conductors 106. Further, each of the dummy structures 102 and the gate conductors 106 has a width (Lg). As illustrated, the width (Lg) is the same for the dummy structures 102 and the gate conductors 106.

Figure 1C:
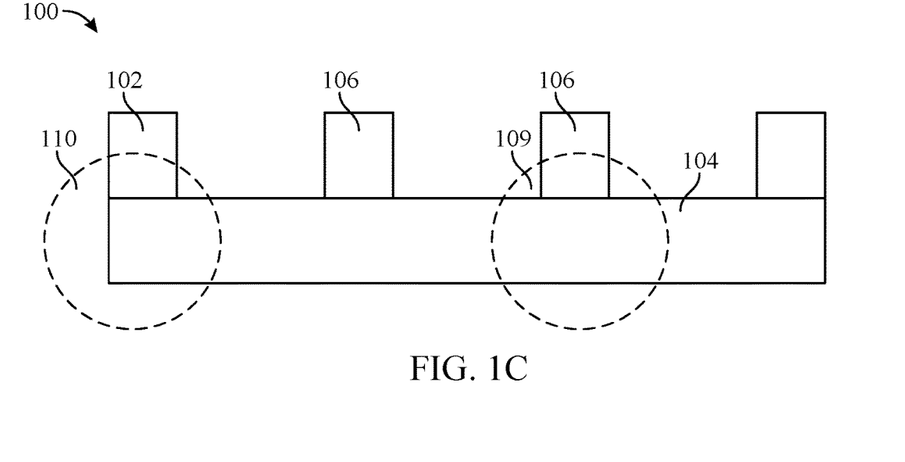
FIG. 1C illustrates a cross-sectional view of a portion of the standard cell of FIG. 1.

FIG. 1C illustrates a cross-section of a portion of the standard cell 100 shown in FIG. 1A. In FIG. 1C, the cross-section is taken along one of the channel structures 104 shown in FIG. 1A. The gate conductors 106 are shown intersecting the channel structure 104 above an upper surface of the channel structure. Active devices, such as finFETs, may be formed at the intersections 109 of the channel structure 104 and the gate conductors 106. A gate dielectric material, such as silicon dioxide ($SiO_2$), may be formed over the one or more channel structures 104 and lie under the gate conductors 106, but is not shown for simplicity. Dummy structures 102 are shown at the edge of the standard cell 100 and protect the ends of the channel structure 104. Dummy devices may be formed at the intersections 110 of the channel structure 104 and the dummy structures 102.

Figure 2:
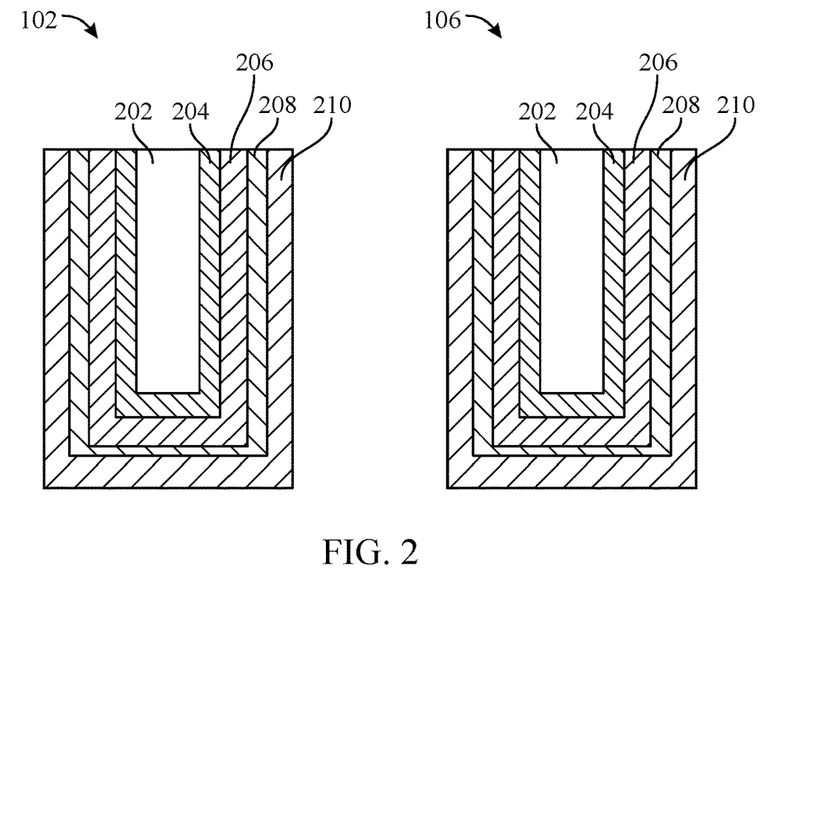
FIG. 2 is a cross-sectional view of a dummy structure and of a gate conductor of the standard cell of FIG. 1.

FIG. 2 is a cross-sectional view of a dummy structure 102 and of a gate conductor 106 of the standard cell 100, illustrating the different layers of each structure. For example, as illustrated, the dummy structure 102 and gate conductor 106 may each include a tungsten (W) layer 202, a first cap layer 204, a negative work function layer 206, a second cap layer 208, and a high dielectric constant (high-κ) layer 210.

The standard cell 100 may be used in a variety of industries, such as the automotive industry. In the automotive industry, reliability of integrated circuits (ICs), is a top concern. For example, automotive ICs should pass stringent reliability criteria and have extremely low defect rate, such as a defective parts per million (DPPM)=1, while commercial products such as ICs for phones, WiFi routers, and the like are acceptable up to 1000 DPPM. As noted above, one way to improve reliability is to introduce dummy structures 102 to cover and protect the ends of the one or more channel structures 104 of the standard cell 100.

However, while the dummy structures 102 generally have no active function in the circuit of the standard cell 100, these dummy structures 102 may be formed over a portion of an active area 108, forming an active device in the silicon and adding parasitic capacitance, resistance, and may also induce leakage current that results in performance and reliability degradation of the standard cell 100. While a certain amount of leakage current may be tolerable in commercial products as described above, this leakage current may render automotive ICs defective (i.e., above the DPPM limit).

Example Transistor Structure with Reduced Leakage Current

Thus, aspects of the present disclosure provide techniques and apparatus to help reduce leakage current and improve reliability of such devices. In some cases, such techniques may involve disposing at least one dummy device at an edge of a transistor structure, wherein the at least one dummy device has a different gate structure than one or more active devices in the transistor structure. In some cases, to reduce leakage current, the at least one dummy device may include a gate structure that includes one or more different layers as compared to a gate conductor corresponding to the one or more active devices. Additionally, in some cases, different design rules and process schemes may be provided related to the dummy structures and active areas to help reduce leakage current.

For example, as noted above, the transistor structure may include one or more active devices and at least one dummy device disposed at an edge of the transistor structure, wherein the at least one dummy device has a different gate structure than the one or more active devices. According to aspects, the transistor structure may be similar to the standard cell 100 and, therefore, aspects of the transistor structure will be described in relation to the standard cell 100 shown in FIGS. 1A-1C. In some cases, the transistor structure may correspond to an N-type ultralow threshold voltage (NuLVT) transistor.

For example, with reference to FIGS. 1A-1C, the transistor structure may include a plurality of parallel channel structures 104. According to aspects, as noted above, the channel structures 104 may comprise a plurality of parallel fins.

Additionally, the transistor structure may include one or more gate conductors 106. According to aspects, each gate conductor 106 may be disposed at least above the plurality of parallel channel structures 104 and may include a longitudinal axis disposed perpendicular to the plurality of parallel channel structures 104. Further, as noted, intersections of the one or more gate conductors 106 and the plurality of parallel channel structures 104 may form the one or more active devices in the transistor structure. As noted above, the one or more active devices may comprise one or more finFETs.

Further, the transistor structure may include at least one dummy structure 102 disposed at the edge of the transistor structure. According to aspects, the at least one dummy structure 102 may be disposed at least above the plurality of parallel channel structures 104 and may include a longitudinal axis disposed perpendicular to the plurality of parallel channel structures 104. Further, as noted, intersections of the at least one dummy structure 102 and the plurality of parallel channel structures 104 may form the at least one dummy device in the transistor structure.

According to aspects, the plurality of parallel channel structures 104 may define an active area 108, also known as an oxide-defined (OD) area, for example, as shown in FIG. 1B. Further, in some cases, the at least one dummy device comprises a polysilicon on oxide-defined edge (PODE) structure.

As noted above, in some cases, to reduce leakage current associated with the at least one dummy device of the at least one dummy structure 102, the at least one dummy structure may comprise one or more different layers as compared to a gate conductor corresponding to the one or more active devices.

Figure 3:
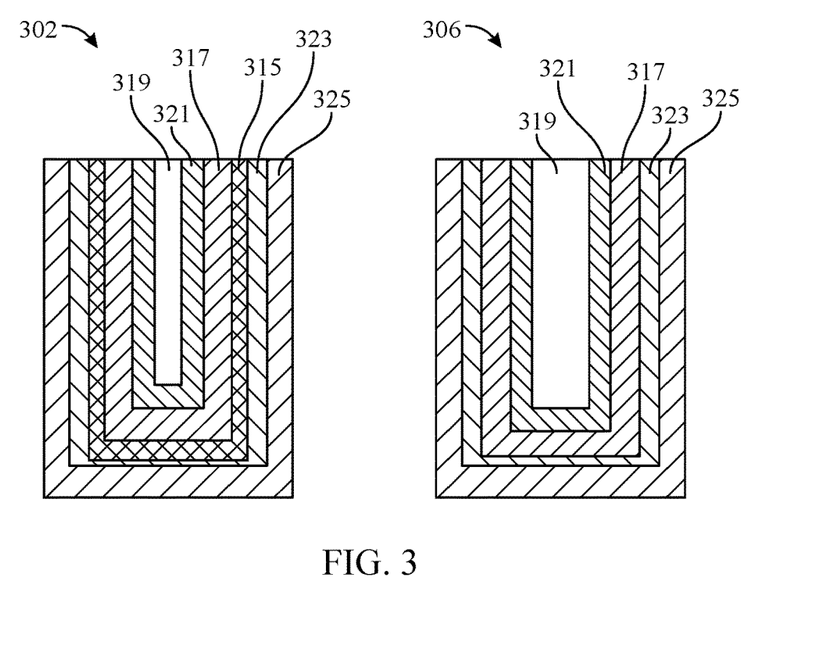
FIG. 3 illustrates different layers of a first gate structure of a dummy device and a second gate structure of an active device, according to certain aspects presented herein.

For example, FIG. 3 illustrates the different layers of a first gate structure 302 and a second gate structure 306, in accordance with aspects of the present disclosure. According to aspects, the first gate structure 302 may be used to implement a dummy structure 102, whereas the second gate structure 306 may be used to implement a gate conductor 106.

As illustrated, the first gate structure 302 and the second gate structure 306 may include differing layers. For example, as illustrated, the first gate structure 302 comprises a positive work function metal layer 315 and a negative work function metal layer 317, while the second gate structure 306 comprises the negative work function metal layer 317 and lacks a positive work function metal layer. Additionally, as illustrated, the first gate structure 302 and the second gate structure 306 may include a tungsten (W) layer 319, a first cap layer 321, a second cap layer 323, and a high dielectric constant layer 325.

According to aspects, the reason to include the positive work function metal layer 315 within the first gate structure 302 is to minimize, or at least reduce, the chances of damage caused to the first gate structure 302 during fabrication of the transistor structure. Damage to the first gate structure 302 may likely increase the leakage current of the dummy device associated with the first gate structure, which may affect subsequent operation of the active devices. In contrast, the active devices may most likely be designed with gate structures having a specified voltage threshold and/or other properties for the desired operation. However, the dummy devices are not typically used for circuit operations, and therefore, the threshold voltage set by the gate structure of a dummy device may not matter. Consequently, the first gate structure 302 may include one or more additional layers (e.g., the positive work function metal layer 315) for extra protection of the dummy devices, whereas the second gate structure 306 may lack such additional layer(s). In some cases, during the fabrication of the transistor structure, the positive work function metal layer 315 may be removed from gate structures associated with the active devices, thereby resulting in the second gate structure 306, whereas the positive work function metal layer 315 may be allowed to remain for the dummy devices, thereby resulting in the first gate structure 302.

As noted above, in some cases, to help reduce leakage current, different design rules and process schemes related to the dummy structures and active area of a transistor structure may be implemented, as illustrated in FIGS. 4A, 4B, 4C, 5A, and 5B. According to aspects, the different design rules and process schemes illustrated in FIGS. 4A, 4B, 4C, 5A, and 5B provide different techniques for reducing or enlarging a size of one or more dummy structures and/or reducing one or more active area dimensions associated with the one or more dummy devices. According to aspects, reducing or enlarging the size of the one or more dummy structures and/or reducing active area dimensions associated with the one or more dummy devices may increase protection characteristics of the dummy devices and reduce the chances of damage to the dummy devices, thereby decreasing potential leakage current of the dummy devices.

As illustrated, the transistor structure 400 may include at least a first gate structure 402 of at least one dummy device and at least a second gate structure 404 of at least one active device. In some cases, the at least one active device may comprise one or more finFETs, as described above. Further, as illustrated, the transistor structure 400 may include an active area 406, which may include a plurality of parallel channel structures (e.g., fins), as noted above. In FIGS. 4A, 4B, 4C, 5A, and 5B, two dummy structures are illustrated, one on each end of the transistor structure 400. In some cases, the at least one dummy structures comprises polysilicon and may be referred to as a PODE structure.

Figure 4A:
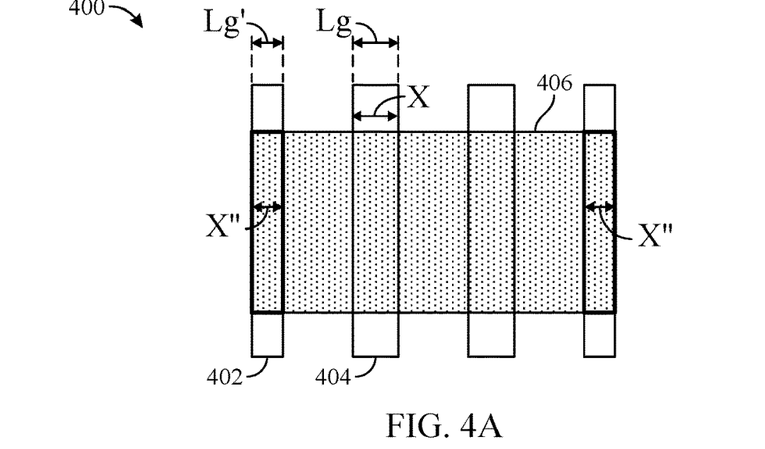
FIGS. 4A-4C conceptually illustrate different design rules and processing schemes for fabricating a transistor structure, according to certain aspects presented herein.

A first design rule and process scheme is illustrated in FIG. 4A. As illustrated, in some cases, the first gate structure 402 of the at least one dummy device has a smaller width than the second gate structure 404 of one of the active devices. For example, as illustrated, the first gate structure 402 may have a first gate width (Lg'), while the second gate structure 404 has a second gate width (Lg). As shown, the first gate width (Lg') of the first gate structure 402 is smaller than the second gate width (Lg) of the second gate structure 404. Additionally, as illustrated in FIG. 4A, a first channel length (X") of the active area 406 disposed underneath the first gate structure 402 of the at least one dummy device may be equal to the first gate width (Lg') of the first gate structure 402. Further, as illustrated in FIG. 4A, the second gate structure 404 of one of the active devices has a second gate width (Lg) that is the same as (i.e., substantially equal to) a second channel length (X) of the active area 406 disposed underneath the second gate structure 404 of the one of the active devices.

Figure 4B:
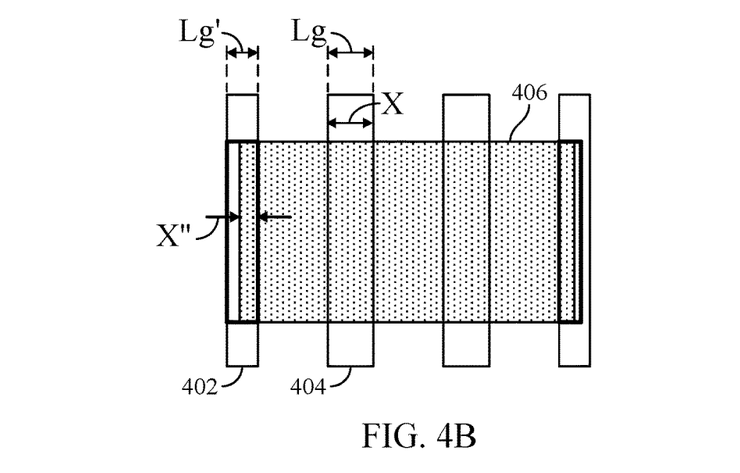

In addition to the first design rule and process scheme illustrated in FIG. 4A where the first gate structure 402 of the at least one dummy device has a smaller width than the second gate structure 404 of one of the active devices, in some cases as illustrated in FIG. 4B, the first gate structure 402 of the at least one dummy device may have a first gate width (Lg') that is greater than a first channel length (X") disposed underneath the first gate structure. In other words, even though the first gate width is smaller than the second gate width, the channel length underneath the first gate structure may be reduced to be lower than Lg'. Similar to FIG. 4A, the second gate structure 404 of one of the active devices may have a second gate width (Lg) that is the same as a second channel length (X) disposed underneath the second gate structure, as illustrated in FIG. 4B.

Figure 4C:
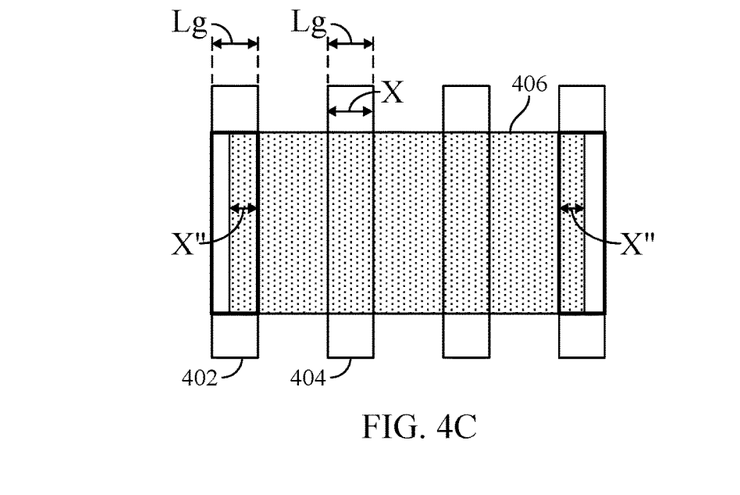

In another design rule and process scheme illustrated in FIG. 4C, the first gate structure 402 of the at least one dummy device has the same gate width (Lg) as the second gate structure 404 of one of the active devices. Additionally, as illustrated, a first gate width (Lg) of the first gate structure 402 is greater than a first channel length (X") of the active area 406 disposed underneath the first gate structure 402. Further, as illustrated in FIG. 4C, a second gate width (Lg) of the second gate structure 404 is the same as a second channel length (X) of the active area 406 disposed underneath the second gate structure 404.

Figure 5A:
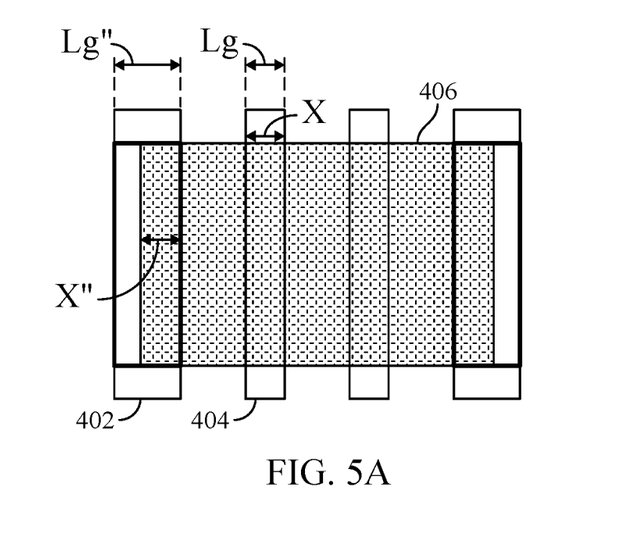
FIGS. 5A-5B conceptually illustrate different design rules and processing schemes for fabricating a transistor structure, according to certain aspects presented herein.

In another design rule and process scheme illustrated in FIG. 5A, the first gate structure 402 of the at least one dummy device has a greater width than a second gate structure 404 of one of the active devices. For example, as illustrated, the first gate structure 402 may have a first gate width (Lg"), while the second gate structure 404 has a second gate width (Lg). As shown, the first gate width (Lg") of the first gate structure 402 is greater than the second gate width (Lg) of the second gate structure 404.

Further, as illustrated in FIG. 5A, the first gate width (Lg") of the first gate structure 402 is greater than a first channel length (X") disposed underneath the first gate structure 402. Also as shown, the second gate structure 404 has a second gate width (Lg) that is the same as a second channel length (X) disposed underneath the second gate structure 404.

Figure 5B:
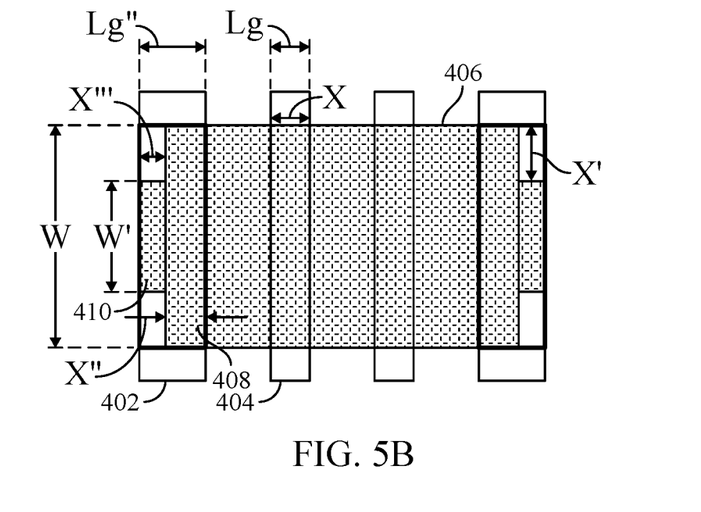

As illustrated in FIG. 5B, in addition to the design rule and process scheme shown in FIG. 5A, in some cases, the active area 406 disposed underneath the first gate structure may comprise a first portion 408 having a first width (W) and a second portion 410 having a second width (W') that is less than the first width (W). As shown, the second width (W') of the second portion 408 may be represented as a difference involving the first width (W) and the width X'. More specifically, the second width (W') of the second portion 408 may be represented as W−2*X'. Additionally, in some cases, a length (X") of the first portion 408 of the active area 406 disposed underneath the first gate structure 402 may be greater than a length (X''') of the second portion 410 of the active area 406 disposed underneath the first gate structure 402. Additionally, as shown, the first gate structure 402 may overhang and extend beyond three consecutive edges of the active area 406.

In other cases, the length (X") of the first portion 408 of the active area 406 disposed underneath the first gate structure 402 is less than (or equal to) the length (X''') of the second portion 410 of the active area disposed underneath the first gate structure 402.

Figure 6:
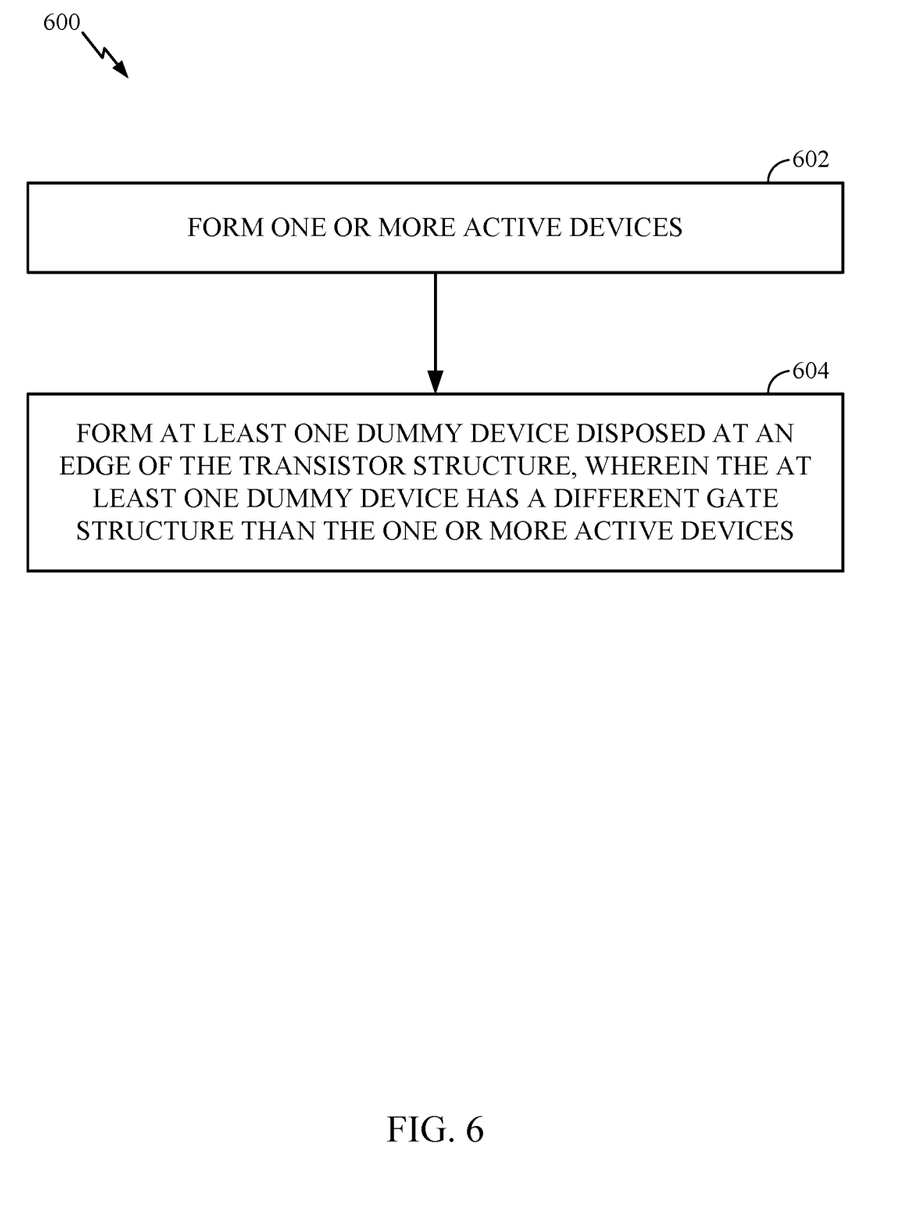
FIG. 6 is a flow diagram illustrating example operations for fabricating a transistor structure, in accordance with certain aspects of the present disclosure.

FIG. 6 is a flow diagram illustrating example operations 600 for fabricating a transistor structure, in accordance with certain aspects of the present disclosure. The operations 600 may be performed, for example, by a semiconductor manufacturing or processing facility (e.g., a foundry).

The operations 600 may begin, at block 602, with the semiconductor manufacturing/processing facility forming one or more active devices. For example, the one or more active devices may comprise one or more fin field-effect transistors (finFETs).

At block 604, the semiconductor manufacturing/processing facility forms at least one dummy device disposed at an edge of the transistor structure. The at least one dummy device has a different gate structure than the one or more active devices.

Additionally, in some cases, the operations 600 for fabricating the transistor structure may include forming a plurality of parallel channel structures (e.g., channel structures 104). Additionally, in some cases, the operations 600 for fabricating the transistor structure may include forming one or more gate conductors (e.g., gate conductor 106 or second gate structure 404). According to certain aspects, each gate conductor may be disposed at least above the plurality of parallel channel structures and may have a longitudinal axis disposed perpendicular to the plurality of parallel channel structures. Additionally, according to certain aspects, intersections of the one or more gate conductors and the plurality of parallel channel structures may form the one or more active devices.

Additionally, in some cases, the operations 600 for fabricating the transistor structure may include forming at least one dummy structure (e.g., dummy structure 102 or first gate structure 402) disposed at the edge of the transistor structure. According to certain aspects, the at least one dummy structure may be disposed at least above the plurality of parallel channel structures and may have a longitudinal axis disposed perpendicular to the plurality of parallel channel structures. According to certain aspects, intersections of the at least one dummy structure and the plurality of parallel channel structures may form the at least one dummy device.

Additionally, in some cases, the plurality of parallel channel structures comprise a plurality of parallel fins. In such cases, the one or more active devices may comprise one or more fin field-effect transistors (finFETs). In other cases, the plurality of parallel channel structures may comprise a plurality of nanosheet structures. In such cases, the one or more active devices may comprise one or more gate-all-around (GAA) transistors.

In some cases, the plurality of parallel channel structures may define an oxide-defined (OD) area (e.g., active area 108, 406). In such cases, the at least one dummy device may comprise a polysilicon on oxide-defined edge (PODE) structure.

Additionally, in some cases, a first gate structure (e.g., first gate structure 302, 402) of the at least one dummy device comprises a positive work function metal layer (e.g., layer 315) and a negative work function metal layer (e.g., layer 317). Additionally, in some cases, a second gate structure (e.g., second gate structure 306, 404) of the one or more active devices comprises a negative work function metal layer and lacks a positive work function metal layer.

Additionally, in some cases, a first gate structure of the at least one dummy device has a smaller width than a second gate structure of one of the active devices (e.g., Lg'<Lg as illustrated in FIG. 4A). In some cases, the first gate structure of the at least one dummy device has a first gate width that is greater than a first channel length disposed underneath the first gate structure (e.g., Lg'>X" as illustrated in FIGS. 4B and 4C). Further, in some cases, the second gate structure of one of the active devices has a second gate width that is the same as a second channel length disposed underneath the second gate structure (e.g., Lg=X as illustrated in FIGS. 4A-4C).

Additionally, in some cases, a first gate structure of the at least one dummy device has a greater width than a second gate structure of one of the active devices (e.g., Lg'>Lg as illustrated in FIG. 5A). Further, in some cases, the first gate structure of the at least one dummy device has a first gate width that is greater than a first channel length disposed underneath the first gate structure (e.g., Lg'>X" as illustrated in FIG. 5B). Further, in some cases, the second gate structure of one of the active devices has a second gate width that is the same as a second channel length disposed underneath the second gate structure (e.g., Lg=X as illustrated in FIG. 5A).

Further, in some cases, an active area (e.g., active area 406) disposed underneath the first gate structure comprises a first portion (e.g., first portion 408) having a first width (e.g., W) and a second portion (e.g., second portion 410) having a second width (e.g., W') that is less than the first width (e.g., as illustrated in FIG. 5B). Further, in some cases, a length of the first portion of the active area disposed underneath the first gate structure is less than a length of the second portion of the active area disposed underneath the first gate structure (e.g., X"<X'"). In other cases, the length of the first portion of the active area disposed underneath the first gate structure of the at least one dummy device is greater than the length of the second portion of the active area disposed underneath the first gate structure of the at least one dummy device (e.g., X">X'" as illustrated in FIG. 5B).

Further, in some cases, a gate structure of the at least one dummy device overhangs and extends beyond three consecutive edges of an oxide-defined (OD) area (e.g., as illustrated in FIG. 5B).

Within the present disclosure, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A transistor structure comprising:
   one or more active devices; and
   at least one dummy device disposed at an edge of the transistor structure, wherein the at least one dummy device has a different gate structure than the one or more active devices, wherein:
     a first gate structure of the at least one dummy device comprises a positive work function metal layer and a negative work function metal layer; and
     a second gate structure of the one or more active devices comprises a negative work function metal layer and lacks a positive work function metal layer.

2. The transistor structure of claim 1, wherein the at least one dummy device comprises a polysilicon on oxide-defined (OD) edge (PODE) structure.

3. The transistor structure of claim 1, wherein a first gate structure of the at least one dummy device has a smaller width than a second gate structure of one of the active devices.

4. The transistor structure of claim 3, wherein:
   the first gate structure of the at least one dummy device has a first gate width that is greater than a first channel length disposed underneath the first gate structure of the at least one dummy device; and
   the second gate structure of the one of the active devices has a second gate width that is the same as a second channel length disposed underneath the second gate structure of the one of the active devices.

5. The transistor structure of claim 1, wherein:
   a first gate structure of the at least one dummy device has a first gate width that is greater than a first channel length disposed underneath the first gate structure of the at least one dummy device; and
   a second gate structure of one of the active devices has a second gate width that is the same as a second channel length disposed underneath the second gate structure of the one of the active devices.

6. The transistor structure of claim 1, wherein a first gate structure of the at least one dummy device has a greater width than a second gate structure of one of the active devices.

7. The transistor structure of claim 6, wherein:
   the first gate structure of the at least one dummy device has a first gate width that is greater than a first channel length disposed underneath the first gate structure of the at least one dummy device; and
   the second gate structure of the one of the active devices has a second gate width that is the same as a second channel length disposed underneath the second gate structure of the one of the active devices.

8. The transistor structure of claim 6, wherein an active area disposed underneath the first gate structure comprises a first portion having a first width and a second portion having a second width that is less than the first width.

9. The transistor structure of claim 8, wherein a length of the first portion of the active area disposed underneath the first gate structure is less than a length of the second portion of the active area disposed underneath the first gate structure.

10. The transistor structure of claim 1, wherein a gate structure of the at least one dummy device overhangs and extends beyond three consecutive edges of an active area.

11. The transistor structure of claim 1, wherein an active area disposed underneath a gate structure of the at least one dummy device comprises a first portion having a first width and a second portion having a second width that is less than the first width.

12. The transistor structure of claim 11, wherein a length of the first portion of the active area disposed underneath the gate structure of the at least one dummy device is greater than a length of the second portion of the active area disposed underneath the gate structure of the at least one dummy device.

13. The transistor structure of claim 1, further comprising:
   a plurality of parallel channel structures;
   one or more gate conductors, each gate conductor being disposed at least above the plurality of parallel channel structures and having a longitudinal axis disposed perpendicular to the plurality of parallel channel structures, wherein intersections of the one or more gate conductors and the plurality of parallel channel structures form the one or more active devices; and
   at least one dummy structure disposed at the edge of the transistor structure, disposed at least above the plurality of parallel channel structures, and having a longitudinal axis disposed perpendicular to the plurality of parallel channel structures, wherein intersections of the at least one dummy structure and the plurality of parallel channel structures form the at least one dummy device.

14. The transistor structure of claim 13, wherein the plurality of parallel channel structures comprise a plurality of parallel fins and wherein the one or more active devices comprise one or more fin field-effect transistors (finFETs).

15. The transistor structure of claim 13, wherein the plurality of parallel channel structures define an oxide-defined (OD) area and wherein the at least one dummy device comprises a polysilicon on OD edge (PODE) structure.

16. The transistor structure of claim 1, wherein:
the at least one dummy device is configured to have no active function; and
the at least one dummy device comprises a first gate structure that includes one or more different layers compared to a second gate structure of the one or more active devices.

17. A method for fabricating a transistor structure, comprising:
forming one or more active devices; and
forming at least one dummy device disposed at an edge of the transistor structure, wherein the at least one dummy device has a different gate structure than the one or more active devices, wherein:
a first gate structure of the at least one dummy device comprises a positive work function metal layer and a negative work function metal layer; and
a second gate structure of the one or more active devices comprises a negative work function metal layer and lacks a positive work function metal layer.

18. The method of claim 17, wherein:
a first gate structure of the at least one dummy device has a smaller width than a second gate structure of one of the active devices;
the first gate structure of the at least one dummy device has a first gate width that is greater than a first channel length disposed underneath the first gate structure of the at least one dummy device; and
the second gate structure of one of the active devices has a second gate width that is the same as a second channel length disposed underneath the second gate structure of the one of the active devices.

* * * * *